United States Patent [19]

Widlar

[11] Patent Number: 4,797,629
[45] Date of Patent: Jan. 10, 1989

[54] WIDE RANGE OPERATIONAL AMPLIFIER INPUT STAGE

[75] Inventor: Robert J. Widlar, Puerto Vallarta, Mexico

[73] Assignee: National Semiconductor Corporation, Santa Clara, Calif.

[21] Appl. No.: 163,573

[22] Filed: Mar. 3, 1988

[51] Int. Cl.$^4$ .............................................. H03F 3/45
[52] U.S. Cl. ..................................... 330/258; 330/252
[58] Field of Search ................ 330/252, 255, 257, 258

[56] References Cited

U.S. PATENT DOCUMENTS 4,232,271 11/1980 Dobkin et al. ...................... 330/258
4,757,273 7/1988 Bray .................................... 330/256

OTHER PUBLICATIONS

Signetics, *Linear LSI Data and Applications Manual 1985*, p. 6-65.

Primary Examiner—Eugene R. Laroche
Assistant Examiner—Steven J. Mottolo
Attorney, Agent, or Firm—Gail W. Woodward; Lee Patch; Mark Aaker

[57] ABSTRACT

A differential input stage for an operational amplifier includes a transistor pair differentially connected and supplied with tail current through a series resistor. The tail current is supplied by a pair of current amplifiers having their outputs coupled to the tail current resistor. The current amplifier inputs are coupled to the bases of the input transistor pair so that they are differentially driven. If the tail current resistor is properly selected the differential output current is a linear function of the differential input voltage. A clamp is provided for the differential input at some relatively large input signal voltage.

11 Claims, 2 Drawing Sheets

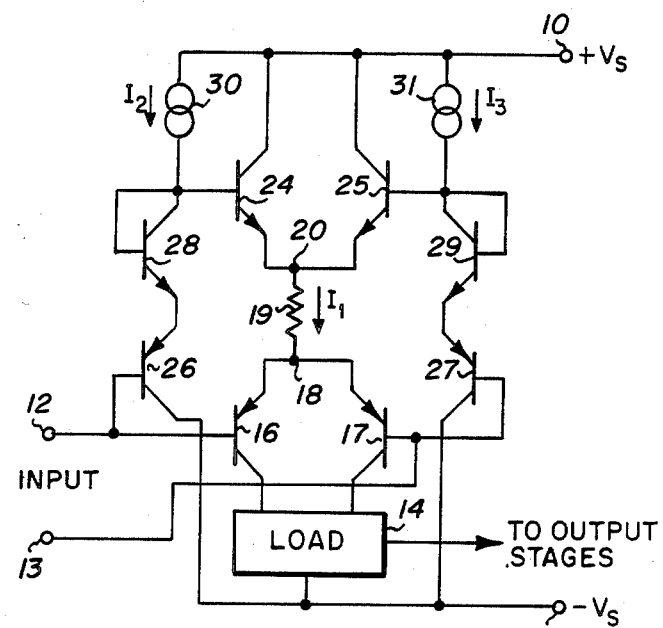
Fig_1
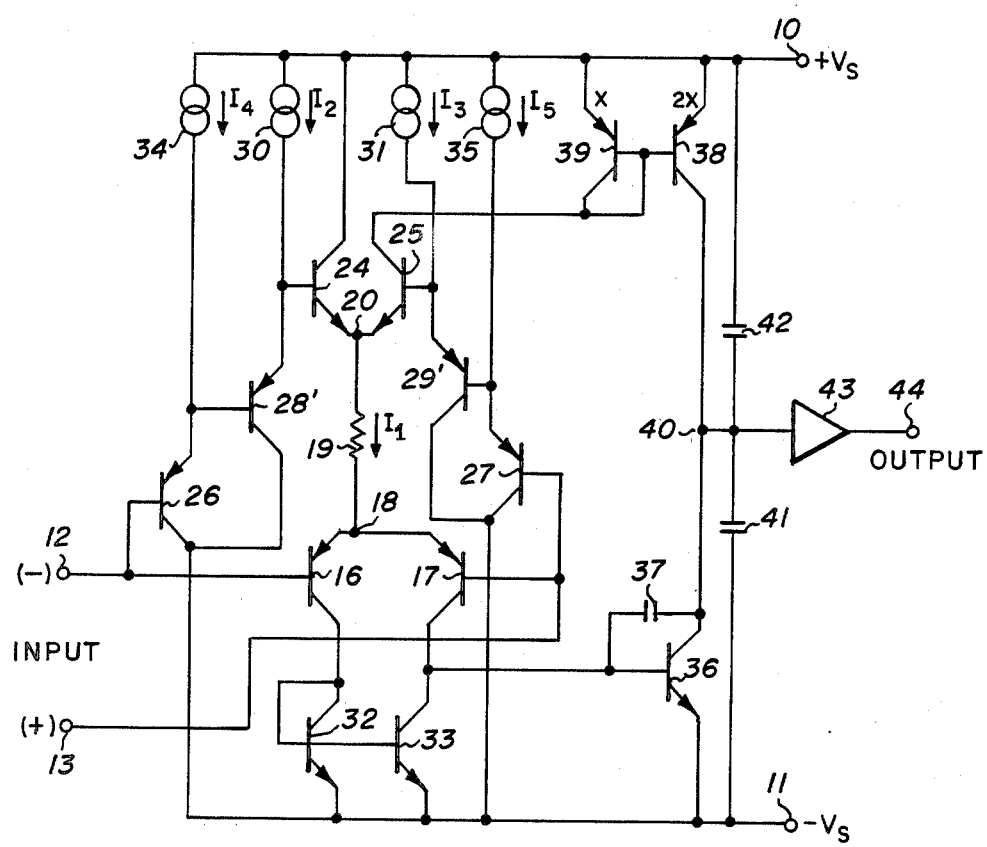
Fig_2

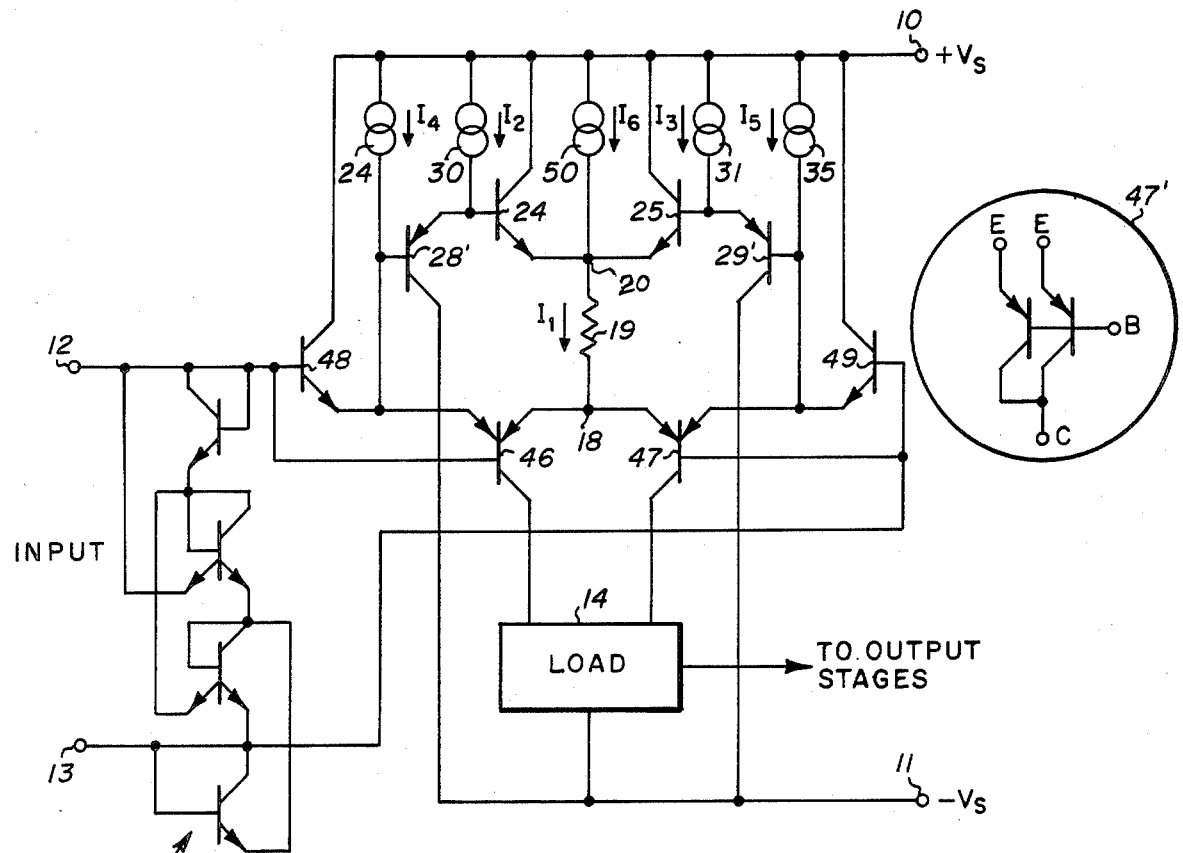
Fig_3

4,797,629

WIDE RANGE OPERATIONAL AMPLIFIER INPUT STAGE

BACKGROUND OF THE INVENTION

Operational amplifiers (op-amps) commonly employ differential amplifier (diff-amp) input stages which have a full response to differential signals while rejecting common mode inputs. Common mode rejection ratios of 100 db are typical in commercial integrated circuit (IC) diff-amps.

When a diff-amp has one input grounded and the other input driven, it typically has a very narrow linear range. The input will limit in terms of output swing for inputs of a few tens of millivolts (typically, about ±60 mv). Thus, any input signal in excess of limiting will result in rail-to-rail output-current swing and what is called "hard limiting" occurs. In some applications hard limiting is undesirable and it is desirable to have the diff-amp output be an essentially-linear response to the input. This linearity should extend over a substantial range.

The slew rate of an op-amp is defined as the change in output voltage per unit time in response to a large input-step function. With an undegenerated bipolar diff-amp for the input, the slew rate is given by:

$$dV_o/dt = 4\pi f_o kT/q$$

where:
- k = Boltzman's constant
- T = Absolute temperature
- q = Electron charge
- $f_o$ = op-amp unity gain bandwidth At 27° C. kT/q is close to 26 millivolts. Therefore, the typical slew rate for an op-amp having a conventional undegenerated bipolar transistor input stage is about $0.32 f_o$. This means that a 10 MHz bandwidth op-amp will typically display a 3.2 volts per microsecond slew rate. This limitation can be circumvented by using degenerative resistance in the input stage, but this degrades the offset voltage and the noise specification. Accordingly, it is desired to avoid degenerative resistance.

SUMMARY OF THE INVENTION

It is an object of the invention to provide a diff-amp input stage having an output current that is proportional to the differential input voltage over a wide range.

It is a further object of the invention to provide a diff-amp input stage that responds normally to small input signal voltage levels and has a nearly-linear output in response to input signal voltage levels substantially in excess of the small input signal voltage level.

It is a still further object of the invention to avoid degenerative resistance in the input stage of an op-amp while producing a high slew rate for large input voltage signals.

These and other objects are achieved as follows. The input stage of an op-amp includes a pair of differentially connected and driven transistors. The emitters of the input transistors are connected to each other and to a source of tail current through a series resistor. The source of tail current is obtained from transistors that are driven or controlled by the differential input voltage. Each of the two input terminals is coupled to a substantially unity-voltage-gain current amplifier having close to one offset voltage. The outputs of the two current amplifiers are commonly coupled to the input pair tail current resistor. At zero differential input voltage the input stage tail current is the combined quiescent currents of the two current amplifiers. When a differential input voltage is present, the higher of the input potentials will raise the potential across the tail current resistor. Thus, the voltage will remain constant near the common mode level. Thus, the voltage cross the tail current resistor will be substantially equal to the differential input voltage. This also means that the tail current is linearly proportional to the differential input. The input stage load circuit combines the input transistor load currents differentially so that the output current is almost a linear replica of the differential input voltage. For the best linearity the tail current resistor should be approximately equal to the reciprocal of the differential transistor input stage transconductance. The input stage has a linear output in response to input signal voltage levels substantially in excess of the normal small input signal voltage level.

BRIEF DESCRIPTION OF THE DRAWING

FIG. 1 is a schematic diagram of the basic circuit of the invention.

FIG. 2 is a schematic diagram of an alternative circuit of the invention.

FIG. 3 is a schematic diagram of another alternative circuit of the invention.

DESCRIPTION OF THE INVENTION

In FIG. 1 the schematic diagram shows power supply rails 10 and 11 which can be respectively connected to the + and − terminals of a $V_S$ power supply.

Typically, the ground level will be midway between the + and − potentials. Input terminals 12 and 13 receive a differential signal voltage input. Load 14 provides a differential to single-ended signal conversion and drives the op-amp output stages. Load 14 can be of the kind disclosed in copending patent application Ser. No. 79,544, filed July 30, 1987, by Mineo Yamatake and titled HIGH GAIN AMPLIFIER USING TWO CURRENT MIRRORS. This application, which is assigned to the assignee of the present application, contains teaching that is incorporated herein by reference.

Input terminals 12 and 13 directly drive the bases of transistors 16 and 17. The emitters in transistors 16 and 17 are coupled together to form node 18. Resistor 19 couples node 18 to node 20. The differential input stage tail current is $I_1$ which flows in resistor 19.

Node 20 is coupled to receive the currents flowing in the emitters of emitter follower transistors 24 and 25. Thus, the tail current ($I_1$) for the differentially connected emitters of transistors 16 and 17 is the sum of the currents in transistors 24 and 25. Since transistors 24 and 25 can only act to pull node 20 up, the potential at this node will be at $I_1 \times R_{19}$ above node 18 which is close to a $V_{BE}$ above the highest potential of input terminals 12 and 13.

The bases of transistors 24 and 25 are respectively driven by emitter follower transistors 26 and 27 through level shifting diodes 28 and 29. The bases of transistors 26 and 27 are respectively coupled to input terminals 12 and 13. Transistor 24 is biased by a current source 30 which passes $I_2$ that flows in diode 28 and transistor 26. Transistor 25 is biased by a current source 31 which passes $I_3$ that flows in diode 29 and transistor 27. Thus, terminal 12 is coupled by way of a current amplifier composed of transistors 26, 28 and 24 to node 20. Terminal 13 is coupled by way of a current amplifier composed of transistors 27, 29 and 25 to node 20. Each of these current amplifiers has close to unity voltage gain and a single $V_{BE}$ voltage shift. Since transistors 16 and 17 provide a single $V_{BE}$ voltage shift to node 18, it can be seen that node 20 will be at a potential above node 18 by close to the differential potential between terminals 12 and 13.

The areas of transistors 26, 28 and 24 and the value of $I_2$ are controlled to determine the quiescent current in transistor 24. Likewise, the areas of transistors 27, 29 and 25, along with the value of $I_3$ are controlled to determine the quiescent current in transistor 25. Therefore, for quiescent conditions, when terminals 12 and 13 are at the same potential, transistors 16 and 17 will conduct a small current equally.

For small differential input signals (less than a few tens of millivolts) the circuit will function normally as a conventional high gain stage and load 14 will respond conventionally. In this condition the transconductance of the stage is:

$$g_m = \frac{qI_E}{2kT}$$

where:
q is the charge of an electron
k is Boltzmanns constant
T is absolute temperature
$I_E$ is the stage tail current As pointed out above, when a large differential input signal is present, it appears across resistor 19. For the best response linearity it is desirable to make the large signal transconductance close to the small signal transconductance. Thus, the value of resistor 19 is desirably $$R_{19} = \frac{2kT}{qI_E}$$

This means that the reciprocal of the tail current resistor value approximates the small signal stage transconductance. As noted above, at 27° C. kT/q is close to 26 millivolts. Thus, for a quiescent emitter current in the ten microampere region, the emitter resistor will be on the order of a few thousand ohms.

Where terminal 13 is above the potential at terminal 12, transistor 25 conduction will dominate to pull node 20 up to close to one diode above terminal 13.

In the case where terminal 13 is below the potential of terminal 12 the opposite conditions develop and the other side of the circuit becomes functional. This will raise the base potential of transistor 24 which will increase its conduction so as to pull terminal 20 up to close to one diode above terminal 12.

In view of the foregoing, it can be seen that when the input signal level exceeds the small signal limit the circuit goes into a second mode of operation which still produces a linear output current as a function of the differential input. In this second mode only one of the input transistors will be conductive.

FIG. 2 shows an alternative circuit that is useful in practicing the invention. Where like parts are employed, similar numerals are used.

Load 14 of FIG. 1 has been replaced by current mirror load transistors 32 and 33 which differentially combine the currents in transistors 16 and 17. One of the main differences is the use of emitter follower transistors 28' and 29' to repace diode connected transistors 28 and 29. Current source 34 passes $I_4$ which flows in transistor 26 and biases transistor 28'. Current source 35 produces $I_5$ which flows in transistor 27 and biases transistor 29'. As before, the relative emitter areas are controlled to establish the quiescent tail current $I_1$.

The collector of transistor 33 is directly coupled to drive the base of transistor 36 which operates as a high gain inverter stage. Capacitor 37 is present to act as a frequency compensation element. Transistor 38 acts as the load for transistor 36 and forms a current mirror with transistor 39. The current flowing in transistor 25 also flows in transistor 39 so that a related current flows in transistor 38. If desired, this current mirror can be configured to have a current gain of X2 as shown.

Thus, as non-inverting input terminal 13 rises the current in transistor 25 rises and an increased current is doubled and fed into node 40 to provide a charge to capacitor 37. This increased current can also charge stray capacitances 41 and 42 which appear at node 40. This action will act to enhance the positive-voltage slew at node 40.

Buffer 43, which ordinarily has a large current gain, repeats the potential at node 40 at output terminal 44. Such a buffer is taught in detail in copending application Ser. No. 79,594 referenced above. Thus, FIG. 2 discloses a complete op-amp. The basic function of the input stage is similar to that of FIG. 1.

FIG. 3 is a schematic diagram of another alternative embodiment of the invention and discloses some other related characteristics. Here input stage transistors 16 and 17 have been replaced by dual emitter transistors 46 and 47 which also perform the functions of transistors 26 and 27 of FIG. 2. A first emitter from each of transistors 46 and 47 are connected together to form node 18. The second emitter of transistor 46 is supplied with $I_4$ from current source 34 and the second emitter of transistor 47 is supplied with $I_5$ from current source 35. Currents $I_4$ and $I_5$ will flow in the collectors of transistors 46 and 47 and if they are matched, will be cancelled out in load 14.

As shown in the inset 47' dual emitter transistor 47 can be constructed in the form of two separate transistors having their bases and collectors connected together. Thus, where a dual emitter structure is disclosed it can alternatively be constructed using two separate transistors.

In this embodiment the quiescent tail current in the differential emitters is determined largely by $I_6$ from current source 50. The quiescent currents in transistors 24 and 25 can be made close to zero. The potential at node 20 will be close to $R_{19} \times I_6$ above node 18 and is independent of the common mode voltage at input terminals 12 and 13.

Transistors 48 and 49 are respectively coupled in parallel with current sources 34 and 35. They are present to aid the circuit in its slewing mode. Both transistors 48 and 49 are biased off normally. Since the second emitter of transistor 46 operates normally one diode above the potential at its base, the emitter-base diode of transistor 48 is reverse biased. A similar situation exists in transistor 49 with relation to transistor 47. When terminal 12 is pulsed positive with respect to terminal 13, the stray capacitance at the second emitter of transistor 46 will prevent its potential rising immediately. This capacitance must be charged before the voltage can slew upwards and this is ordinarily done by the current I₄ in source 34. This creates a design problem. The designer wants I₄ to be small so that the total input bias current is reasonably low. However, a small value of I₄ slows the pulse slewing performance.

When transistor 48 is present and when a positive pulse is applied to terminal 12, so that the base of transistor 48 rises one diode above its emitter, it will conduct and the emitter node will be rapidly slewed upwards. The greater the input pulse the greater will be the conduction in transistor 48 and the slew rate thereby increased. Transistor 49 acts in the same way to pull the second emitter of transistor 47 upward when a positive pulse is applied to terminal 13 with respect to terminal 12.

Input terminals 12 and 13 are connected directly to clamp 51 which acts to limit the differential input potential swings Four transistors are shown, two of which have dual emitters. In effect there are six diodes present in clamp 51. This clamp will limit the input swing to three dides of both input polarities. Thus, at 300° K., the input differential cannot exceed about 1.8 volts. Clearly, other well-known signal clamping circuitry could be employed.

While the above-described circuits employ PNP input transistors, NPN devices could be employed. In this case all of the transistors would be complemented and the power supply polarity reversed. This would also reverse all of the indicated currents.

EXAMPLE

The circuit of FIG. 3 was constructed in monolithic silicon, PN junction isolated, IC form. The transistors were constructed using the process disclosed in copending application Ser. No. 853,530, filed Apr. 18, 1986, by J. Barry Small and Matthew S. Buynoski. This application is titled A HIGH VOLTAGE COMPLEMENTARY NPN/PNP PROCESS and is assigned to the assignee of the present invention. The transistors of both polarities thus produced have beta values typically in excess of 200 and both the PNP and NPN devices operate at frequencies in excess of 100 MHz. The following component values were employed:

| COMPONENT | VALUE |
| --- | --- |
| Resistor 19 | 1.25K ohms |
| Current source 50 | 40 microamperes |
| Current sources 34 and 35 | 20 microamperes |
| Current sources 30 and 31 | 120 microamperes |

The input stage was employed to drive the load circuit and output stages of the amplifier disclosed in copending patent application Ser. No. 79,544 (referenced above). The resultant diff-amp had a gain-bandwidth of 15 MHz, a slew rate of 120 volts per microsecond, a small signal gain of 200 V/mv and the input stage displayed linear output response to differential inputs up to about 1.8 volts.

The invention has been described and its performance detailed. When a person skilled in the art reads the foregoing description, alternatives and equivalents, within the spirit and intent of the invention, will be apparent. Accordingly, it is intended that the scope of the invention be limited only by the following claims.

I claim:

1. A differential amplifier input stage having differential signal input terminals, said stage being operative over a wide range of input signal potentials and connectable to positive and negative power supply terminals, said circuit comprising:

first and second input transistor means, each one including collector, base and emitter electrodes;

means for coupling said input transistor base electrodes to said signal input terminals;

means for coupling said collector electrodes to a common load circuit for responding to the differential collector currents in said first and second input transistor means;

means for coupling said emitters of said first and second input transistor means together and to the first end of a series resistor, the other end of which is coupled to a tail current supply;

a first current amplifier having an input coupled to said base of said first transistor means and an output coupled to said other end of said series resistor; and a second current amplifier having an input coupled to said base of said second transistor means and an output coupled to said other end of said series resistor.

2. The differential amplifier input stage of claim 1 wherein said first and second current amplifiers have substantially unity voltage gain, act as non-inverting buffers and supply tail current to said first and second transistor means.

3. The differential amplifier input stage of claim 2 wherein said first and second current amplifiers produce a voltage shift of one diode whereby the base to emitter voltage drops in said first and second transistor means are offset.

4. The differential amplifier input stage of claim 1 wherein said load circuit provides a differential to single-ended signal and is coupled to drive the base of a common emitter signal inverting transistor which has a compensation capacitor coupled between its base and collector and wherein its collector comprises a circuit node coupled to drive an output buffer which thereby completes an operational amplifier and one of said current amplifiers has an output that is coupled to drive the input of a current mirror which has an output coupled to said circuit node whereby the circuit node capacitance is supplied with driving current for pulsed input conditions and the circuit slewing performance is enhanced.

5. The differential amplifier input stage of claim 1 further comprising:

a first slewing transistor for large differential input having its emitter coupled to said emitter of said first input transistor means, its collector coupled to a source of reference potential and its base coupled to said base of said first input transistor means; and a second slewing transistor for large differential input having its emitter coupled to said emitter of said second input transistor means, its collector coupled to a source of reference potential and its base coupled to said base of said second input transistor means.

6. The differential amplifier input stage of claim 5 wherein said input transistor means are PNP devices, each of said first and second pairs of complementary cascaded emitter follower transistors employ a PNP transistor driving an NPN transistor and said slewing transistors are NPN devices.

7. The differential amplifier input stage of claim 5 wherein said input transistors means are NPN devices, each of said first and second pairs of complementary cascaded emitter follower transistors employ an NPN transistor driving a PNP transistor and said slewing transistors are PNP devices.

8. The differential amplifier input stage of claim 1 further comprising voltage limiting means coupled between said differential signal input terminals to define the maximum range of differential input-signal potentials.

9. The differential amplifier input stage of claim 1 wherein the value of said series resistor has a value selected to ensure that small signal response transconductance of the stage approximates large signal response transconductance.

10. The differential amplifier input stage of claim 1 wherein said first and second input transistor means both include a dual emitter transistor wherein the first emitters are connected together to produce a differential pair and the second emitters are coupled to provide the input stages of said first and second current amplifiers.

11. The differential amplifier input stage of claim 1 wherein a constant current tail current supply is coupled to said other end of said series resistor.

* * * * *